US006909347B2

(12) United States Patent
Wakuda et al.

(10) Patent No.: US 6,909,347 B2
(45) Date of Patent: Jun. 21, 2005

(54) MAGNET FOR MAGNETIC RESONANCE IMAGING APPARATUS

(75) Inventors: Tsuyoshi Wakuda, Hitachi (JP); Michiya Okada, Mito (JP); Shigeru Kakugawa, Hitachi (JP); Hiroyuki Watanabe, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/316,827

(22) Filed: Dec. 12, 2002

(65) Prior Publication Data

US 2003/0122643 A1 Jul. 3, 2003

(30) Foreign Application Priority Data

Dec. 14, 2001 (JP) ......................................... 2001-380831

(51) Int. Cl.⁷ ............................................... H01F 1/00
(52) U.S. Cl. ..................................... 335/296; 335/299
(58) Field of Search .......................... 335/216, 296–306; 324/318–322; 600/421; 505/892

(56) References Cited

U.S. PATENT DOCUMENTS

| 5,012,217 | A | * | 4/1991 | Palkovich et al. | 335/301 |
| 5,315,276 | A | * | 5/1994 | Huson et al. | 335/216 |
| 5,347,252 | A | * | 9/1994 | Ries | 335/299 |
| 5,359,310 | A | * | 10/1994 | Pissanetzky | 335/301 |
| 6,211,676 | B1 | * | 4/2001 | Byrne et al. | 324/319 |
| 6,396,377 | B1 | * | 5/2002 | Ying | 335/300 |

FOREIGN PATENT DOCUMENTS

| EP | 0 525 246 A | 2/1993 |
| EP | 0 817 211 A1 | 1/1998 |
| EP | 0 940 687 A2 | 9/1999 |
| JP | 61-117213 | 6/1986 |
| JP | 07-204174 | 8/1995 |
| JP | 09-190913 | 7/1997 |
| JP | 10-4010 | 1/1998 |
| WO | WO 93 15514 A | 8/1993 |

* cited by examiner

*Primary Examiner*—Lincoln Donovan
(74) *Attorney, Agent, or Firm*—McDermott Will & Emery LLP

(57) ABSTRACT

A magnet for MRI apparatus has a magnetic circuit which includes a magnetic flux path formed by a ferromagnetic material and a magnetic flux path formed by magnetic flux return coils or magnetic flux control coils, so that a 5-gauss line of leakage fluxes can be kept within a sphere 3 m in radius even when the static magnetic field intensity exceeds 1 tesla and a comparatively light magnet for MRI apparatus can be provided. Further, the fluxes escaping vertically from the static magnetic field sources are led compactly to a horizontal direction by installing magnetic flux paths of ferromagnetic materials and coils with polarities opposing those of the static magnetic fields. This arrangement minimizes an increase in the total height of the magnet for MRI apparatus, keeping the magnet within the total height of 3 m.

9 Claims, 6 Drawing Sheets

11a,b 11a,b

MAGNET FOR MAGNETIC RESONANCE IMAGING APPARATUS

BACKGROUND OF THE INVENTION

The present invention relates to a magnet, for example a magnetic assembly suited for magnetic resonance imaging apparatus, and more particularly to a homogeneous magnetic field generating apparatus having an open type magnet with a particularly wide opening.

A magnetic resonance imaging apparatus (hereinafter referred to as an MRI apparatus) produces an image showing physical and chemical properties of a subject under inspection by utilizing a nuclear magnetic resonance phenomenon that occurs when the subject placed in a homogeneous static magnetic field is irradiated with an electromagnetic wave. The MRI apparatus is used particularly for medical treatments.

The MRI apparatus mainly includes a static magnetic field generating unit to apply a homogeneous static magnetic field in an imaging volume, an RF coil system to transmit and receive an electromagnetic wave, and a gradient magnetic field generating unit to apply a gradient magnetic field that gives position information on a resonant phenomenon.

The MRI apparatus can be divided into two general categories mainly in terms of a magnetic field application method. One is a horizontal magnetic field apparatus in which an imaging volume is placed in an internal space of a group of coils arranged coaxially in multiple layers, and the other is a vertical magnetic field apparatus (open type) in which an imaging volume is sandwiched between opposing coil groups. Because of its openness the vertical magnetic field apparatus reduces a psychological burden on a patient and significantly improves an accessibility to the patient by an inspector.

In the MRI apparatus, an increase in the intensity of static magnetic field results in an increased resonant signal strength, which in turn leads to a reduced imaging time and a higher function imaging. Therefore, efforts are being made to enhance the intensity of magnetic field. Simply increasing a magnetomotive force of a magnetic field source for a higher magnetic field strength naturally increases leakage fluxes. The open type MRI apparatus employs a method of confining or canceling the magnetic flux leaking from a source of magnetic field to reduce the leakage fluxes.

As the method for reducing leakage fluxes there are mainly three types: a passive shield type, an active shield type and a toroidal coil type (JP-A-10-4010). The toroidal coil type, for example, is described in JP-A-10-4010.

SUMMARY OF THE INVENTION

One of objects of the present invention is to provide a compact magnet for MRI apparatus with high static magnetic field intensity in which a spread of leakage flux is small.

Another object of the present invention is to provide a magnet for open type MRI apparatus which generates a static magnetic field intensity of 1 tesla or higher to meet requirements for higher imaging capabilities of the open type MRI apparatus, and in which, for better installability, a 5-gauss line of leakage fluxes lies within a radius of about 3.5 m to make the magnet relatively light and compact enough to be installed in common operation rooms.

A still another object of the present invention is to provide an MRI apparatus which can meet requirements for higher imaging capabilities and is made compact and relatively light for better installability.

One aspect of the present invention provides a relatively light magnet that has magnetic flux paths formed by ferromagnetic materials and magnetic flux paths formed by magnetic flux return coils or magnetic flux control coils whereby even if the static magnetic field intensity exceeds 1 tesla, the 5-gauss line of leakage fluxes can be kept within a sphere 3 m in radius.

Further, this invention is characterized in that the fluxes that would otherwise escape vertically from the static magnetic field sources are led compactly to a horizontal direction by the magnetic flux paths of ferromagnetic materials and coils whose polarities are opposite to those of the static magnetic fields. This arrangement can minimize an increase in the overall height of the magnet and keep the total height of the magnet within 3 m.

Further, in a magnet for generating MRI static magnetic fields which is constructed of poles and coils disposed to face each other with an imaging volume in between, the present invention is characterized by a magnetic circuit that returns generated fluxes to the magnetic field sources and which comprises magnetic flux paths formed by ferromagnetic materials and magnetic flux paths formed by current flowing in the coils.

In a passive shield type magnet the magnetic circuit is formed totally of ferromagnetic materials such as iron, whereas in a toroidal coil type magnet it is formed completely from coils. The passive shield type is most effective for reducing leakage fluxes although it has a disadvantage of a large weight. The toroidal coil type, though it can reduce its weight drastically, has difficulty constructing virtual toroidal coils, i.e., the coils whose flux leaking gaps are small enough for a leakage flux space scale under consideration which measures about 5–6 m across. The leakage fluxes therefore tend to increase. Taking this fact into consideration, the present invention is characterized in that a part of the magnetic circuit in the passive shield type magnet is replaced with coils that store magnetic flux quantities passing therethrough. This arrangement realizes a weight reduction of the magnet while maintaining the leakage fluxes of almost the same magnitude as the passive shield type.

Further, a magnetizing current flows in the surface of the magnetic flux paths of the ferromagnetic materials making up the magnetic circuit, with the result that a ring current arranged in a C-shaped configuration reduces the leakage fluxes as in the toroidal coil type. The use of the ferromagnetic materials may seem equivalent to using coils but is actually not so. The advantage of using the ferromagnetic materials is the ability to easily control the geometry of the ring current that confines the magnetic field and the fact that the ferromagnetic materials have larger permeabilities than air. Compared to the ring currents formed by the coils, the magnetic paths of the ferromagnetic materials can easily be formed into a desired shape, making it possible to build magnetic flux paths that are effective in controlling the flow of fluxes. Further, since the fluxes tend to flow to where the permeability is larger, the ferromagnetic material has an effect of confining the nearby fluxes into it. With the advantages described above, this invention can reduce the leakage fluxes more than the toroidal coil type which can hardly make coils virtually toroidal.

Further, with this invention it is possible to form slits in the magnetic flux paths of ferromagnetic materials or use materials having a magnetic anisotropy to positively control the direction in which the fluxes flow, thus effectively reducing the leakage fluxes.

The total height of the magnet is limited to 2.5–3 m at most to facilitate its installation. In the open type MRI magnet, the fluxes generated vertically in the imaging volume need to be led out to a horizontal direction and returned to the magnetic field sources. Considering electromotive forces acting on coil windings and the ease of winding, making coils in geometries other than a circle is generally difficult. Hence, in the toroidal coil type, it is very difficult to build a compact magnet that can meet the specifications described above. Since in this invention the magnetic flux paths for leading the magnetic fluxes to a horizontal direction are constructed of ferromagnetic materials, it is possible not only to form magnetic flux paths of a desired geometry but also to utilize the permeabilities and even magnetic anisotropies of the ferromagnetic materials to sharply confine the fluxes near the magnet. This in turn allows the magnet to be reduced in height.

These and other features and advantages of this invention will be described in more detail in the following.

With this invention a compact magnet can be provided which is designed for an MRI apparatus with a high static magnetic field strength and which has a small spread of leakage fluxes.

Further, with this invention, an MRI apparatus can be provided which can meet requirements for higher imaging capability and which is compact and relatively light in weight, improving its installability.

Other objects, features and advantages of the invention will become apparent from the following description of the embodiments of the invention taken in conjunction with the accompanying drawings.

DESCRIPTION OF THE EMBODIMENTS

The MRI apparatus mainly includes a static magnetic field generating unit to apply a homogeneous static magnetic field in an imaging volume, an RF coil system to transmit and receive an electromagnetic wave, and a gradient magnetic field generating unit to apply a gradient magnetic field that gives position information on a resonant phenomenon.

The MRI apparatus can be divided largely into two categories mainly in terms of a magnetic field application method. One is a horizontal magnetic field apparatus in which an imaging volume is placed in an internal space of a group of coils arranged coaxially in multiple layers, and the other is a vertical magnetic field apparatus (open type) in which an imaging volume is sandwiched between opposing coil groups. Because of its openness the vertical magnetic field apparatus reduces a psychological burden on a patient and significantly improves an accessibility to the patient by an inspector. Therefore, the vertical magnetic field apparatus is becoming a mainstream of the MRI apparatus.

Figure 2:
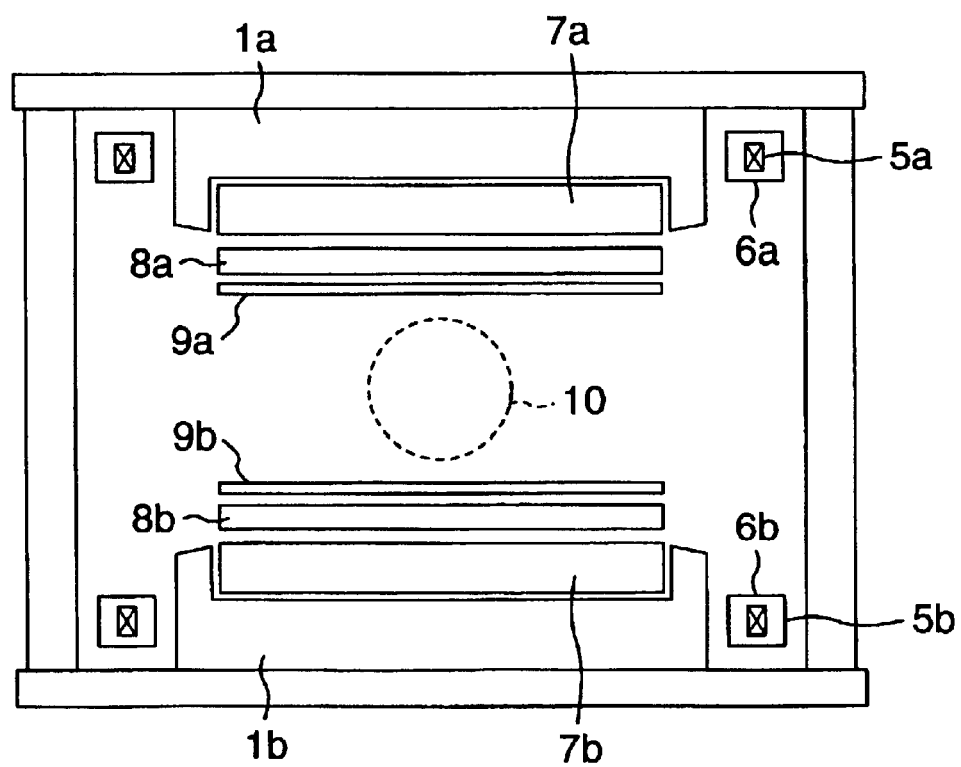
FIG. 2 is a cross-sectional view showing a concept of an open type MRI apparatus.

FIG. 2 shows an example construction of an open type MRI apparatus. Main constitutional elements of the apparatus include magnetic poles 1a, 1b for applying a homogeneous magnetic field to an imaging area 10 that forms an imaging volume, superconducting magnets 5a, 5b as a source of magnetomotive force, cryostats 6a, 6b for keeping the superconducting magnets at low temperatures, gradient magnetic field coils 7a, 7b for applying a gradient magnetic field that gives position information on a resonant phenomenon, RF coil systems 8a, 8b for transmitting and receiving electromagnetic waves, and homogeneity adjusting units 9a, 9b for adjusting a field homogeneity in the imaging volume. These pairs are opposed to each other with the measurement space in between.

Since the MRI apparatus are mainly installed in hospitals for medical treatments, not only is the imaging performance, the primary object of the apparatus, important but an ease of installation of the MRI apparatus also matters. A dominant factor that determines the ease of installation is the size and weight of the MRI apparatus and the spread of the magnetic flux leaking from the MRI apparatus. As for the size and weight of the apparatus, it is needless to say that the smaller and the lighter, the better. As for the leakage fluxes, a value of 5 gauss is used as a criterion for the magnetic field strength that does not affect pacemakers and other medical equipment and it is required that the magnetic field strength at least outside a room where the MRI apparatus is installed be 5 gauss or less.

In the MRI apparatus, since an increase in the intensity of static magnetic field results in an increased resonant signal strength leading to a reduced imaging time and a higher function imaging, efforts are being made to enhance the intensity of magnetic field. Simply increasing a magnetomotive force of a magnetic field source for a higher magnetic field strength naturally increases leakage fluxes. The open type MRI apparatus employs a method of confining or canceling the magnetic flux leaking from a source of magnetic field to reduce the leakage fluxes.

For reducing leakage fluxes mainly three types of method are available: a passive shield type, an active shield type and a toroidal coil type (e.g., Japanese Patent Laid-Open No. 10-4010). In the passive shield type, two opposing magnetic field generating sources are linked together with a ferromagnetic material such as iron to form a magnetic flux path so that a magnetic flux generated by one of the magnetic field generating sources is confined within the flux path and returned to the other magnetic field generating source, thus reducing the leakage fluxes. In the active shield type, shield coils that generate opposing magnetic fields are arranged on the outer sides of the opposing magnetic field generating sources to cancel out external leakage fluxes thereby reducing them. In the toroidal coil type, because a perfect toroidal coil completely eliminates the leakage fluxes, the coils are arranged in a C-shaped configuration like the toroidal coils to reduce the leakage fluxes.

While the passive shield type can reduce the spread of leakage fluxes and maximize the center magnetic field strength and therefore can reduce the magnetomotive force of the magnet, because the magnetic circuit is constructed of a ferromagnetic material such as iron, the weight of the magnet becomes very heavy. In the active shield type, although the magnet weight is reduced, since a shield magnetic field is generated in a direction that cancels out the static magnetic field necessary for imaging, the magnetomotive force of the magnet tends to increase and the leakage fluxes become comparatively large. In the toroidal coil type, since a magnetic field is generated in a way that does not cancel out (but rather increases) the static magnetic field of the imaging volume, it is advantageous from the standpoint of magnetomotive force and the weight of the magnet is comparatively small. In practice, however, arranging the coils in a perfect toroidal coil configuration is difficult and magnetic fluxes leak from gaps between coils arranged in a toroidal shape. As a result, the leakage fluxes are not reduced as expected and the structure of the magnet itself tends to become complex and large.

Figure 1:
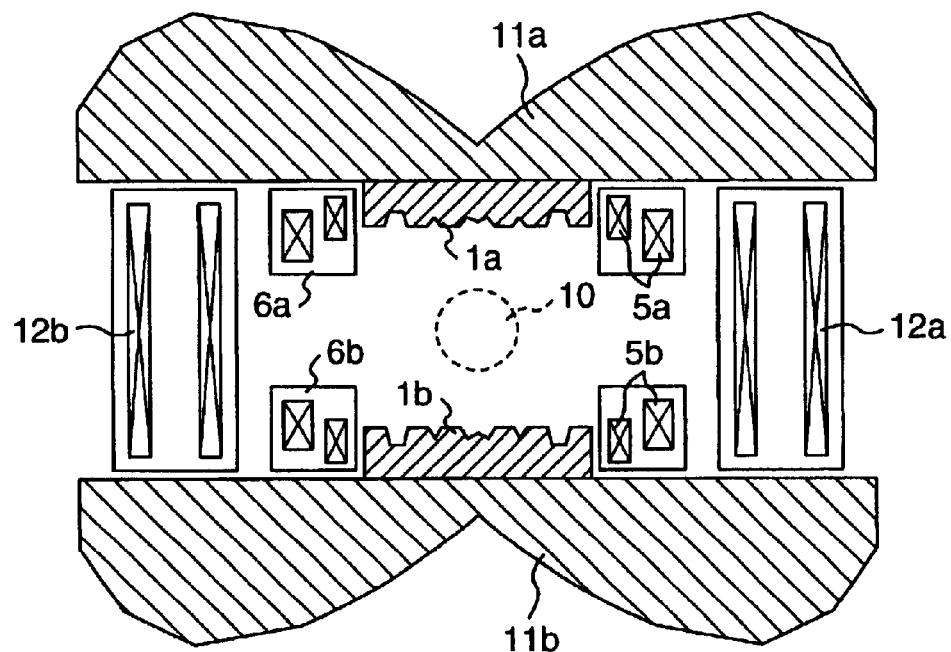
FIG. 1 is a cross-sectional view showing a configuration of a magnet of one embodiment of the present invention.
Figure 3:
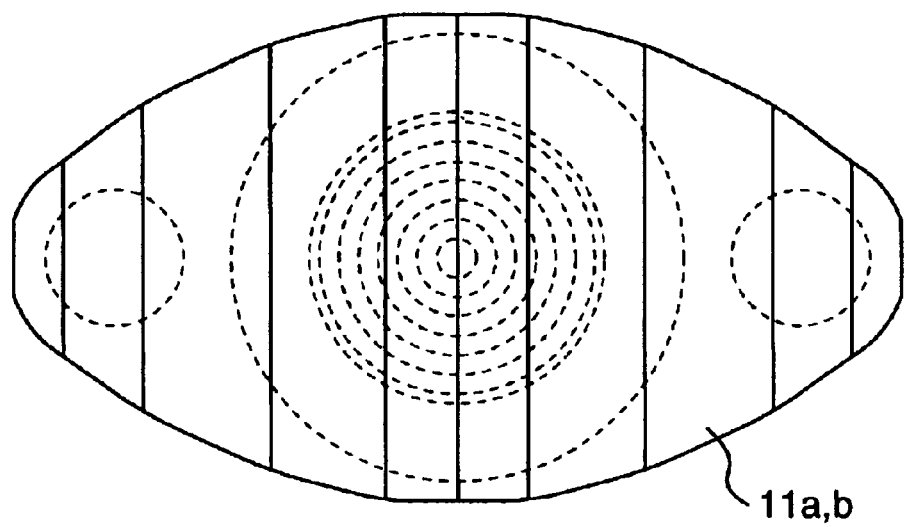
FIG. 3 is a top view showing a construction of the magnet for the MRI apparatus according to the embodiment of the invention.

FIG. 1 and FIG. 3 show a cross-sectional view and a top view of the magnet for the MRI apparatus according to one embodiment of this invention. In the MRI apparatus magnet, static magnetic field generating units are opposed to each other with an imaging volume in between. The static magnetic field generating units includes superconducting magnets 5a, 5b, 5c, 5d, cryostats 6a, 6b containing the superconducting magnets 5a, 5b, 5c, 5d, and magnetic poles 1a, 1b of a magnetic material arranged to concentrate or disperse magnetic flux lines threading through the superconducting magnet in the imaging area 10 as the imaging volume. Installed beside the static magnetic field generating units are magnetic flux return coils 12a, 12b that generate magnetic fields of polarities that oppose those of the magnetic fields generated by the static magnetic field generating units in the imaging area 10 as the imaging volume, and cryostats 13a, 13b accommodating the magnetic flux return coils 12a, 12b. Yokes 11a, 11b are arranged to link end faces of the static magnetic field generating units with end faces of the magnetic flux return coils to form a magnetic circuit.

A magnetic flux generated in a vertically upward direction in the imaging area 10 or the imaging volume by the static magnetic field generating units passes through the upper static magnetic field generating unit, is led out in a horizontal direction by the upper yoke 11a, passes downward through the magnetic flux return coils 12a, 12b, is converged horizontally by the lower yoke 11b to the lower static magnetic field generating unit, and passes upward through the lower static magnetic field generating unit, thus making a complete circuit. By designing a cross section of the magnetic circuit of the ferromagnetic material and also designing a magnetic flux quantity generated by the magnetic flux return coils 12a, 12b, i.e., their magnetomotive forces, and cross sections of the magnetic flux return coils in such a way as to pass the magnetic flux quantity generated by the static magnetic field generating units, it is possible to confine the flux generated by the static magnetic field generating units in this magnetic circuit, thus reducing the leakage fluxes.

In this embodiment, two magnetic flux return coils 80 cm in inner diameter are arranged to realize a magnet that has a static magnetic field strength of 1.5 tesla and a 5-gauss line of the leakage fluxes lying within a sphere 2.9 m in radius. The use of the yokes 11a, 11b has made it possible to confine the leakage fluxes to the proximity of the static magnetic field generating units. By optimizing the geometries of the yokes 11a, 11b, a total height of the magnet that meets the specifications described above can be kept within 2.4 m. Since the magnetic circuit is constructed of the yokes and the magnetic flux return coil currents, the total weight of the yokes can be made small at about 42 tons. Comparing it with an existing open type MRI apparatus currently available in the market which has a static magnetic field strength of 0.7 tesla and a total weight of 40 tons, the apparatus of this embodiment has kept its weight at nearly the same level while its static magnetic field strength has doubled. This practically means that this invention has realized a weight reduction.

This embodiment is characterized in that the portions of the magnetic circuit that return the fluxes vertically, i.e., the column portions, are constructed of coils, not ferromagnetic paths. Constructing these columns by using a ferromagnetic material requires the cross-sectional areas of these columns to be increased proportionally with an increase in the static magnetic field strength, thus reducing the level of openness at an opening of the magnet. With these columns constructed of the magnetic flux return coils, the coil magnetomotive force needs only to be increased according to an increase in the static magnetic field strength, minimizing the influence on the openness of the magnet.

In this embodiment, two magnetic flux return coils 12a, 12b of 80 cm in inner diameter were used which were made from NbTi, a superconducting material most commonly used in a low magnetic field range. The maximum magnetic field to which the magnetic flux return coils are subjected is 4 tesla or less. In enhancing the openness of the magnet, it is effective to reduce the diameter of the magnetic flux return coil columns. However, because a certain magnetic flux quantity passing through the magnetic flux return coil columns must be secured, the maximum magnetic field experienced by the reduced-diameter magnetic flux return coil columns increases. Roughly speaking, the experienced magnetic field is inversely proportional to the diameter of the magnetic flux return coils squared. For example, if $Nb_3Sn$ having a stronger resistance against the magnetic field is used to construct the magnetic flux return coils, their diameters can be reduced to 60 cm, further improving the openness of the magnet.

Since the current that the superconducting material can conduct is limited by the magnetic field to which the superconducting material is subjected, it is necessary to select a superconducting material that can conduct current under a higher magnetic field in order to reduce the diameter of the magnetic flux return coils. Such materials include superconducting metals such as $Nb_3Sn$, $Nb_3Al$ and $MgB_2$, or superconducting oxides such as Bi—, Y—, Hg—and Tl-based materials. The diameter of the column portions may also be reduced by using a material with a high critical temperature for the coils to simplify the structure of the cryostats which hold the magnetic flux return coils. Such materials include superconducting oxide materials such as Bi—, Y—, Hg—and Tl-based materials and metal materials with a relatively high critical temperature, such as $MgB_2$.

If the magnet is constructed of superconducting coils and the operation of the magnet requires a medium such as liquefied helium and liquefied nitrogen, cooling equipment such as a cooling medium tank, a heat exchanger and a refrigerator are needed. These equipment may be installed in internal spaces of the magnetic flux return coil currents to eliminate the need for an additional space for their accommodation, rendering the magnet compact.

Figure 4:
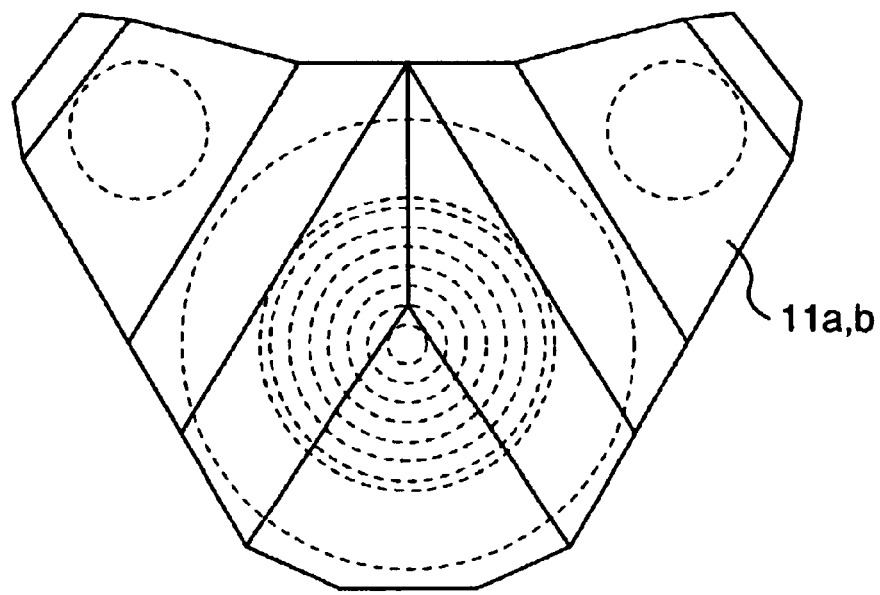
FIG. 4 is a top view showing a construction of the magnet for the MRI apparatus according to another embodiment of the invention.

While this embodiment has two magnetic flux return coils to secure two magnetic flux return paths, other configurations may be employed. According to a design of leakage flux geometry and an openness at the opening of the magnet, the apparatus may have only one magnetic circuit or the so-called C type configuration, or additional magnetic flux return coils may be used. A primary cause for the leakage fluxes in the magnet with the magnetic circuit of this embodiment is the presence of gaps between the magnetic flux paths of ferromagnetic materials and the return coils. To make the spread of the 5-gauss line of leakage fluxes small, it is effective to distributively arrange a plurality of flux return paths. The magnetic flux return coils 12a, 12b and the static magnetic field generating units, when viewed from above, are arranged in line. By shifting the positions of the magnetic flux return coils, a magnet opening on the side that is frequently accessed can be made wide and more easily accessible, as shown in FIG. 4.

Further, arranging with a good balance the ferromagnetic material flux return paths that form a plurality of magnetic flux return paths makes it possible to control the spread of leakage fluxes caused by residual magnetizations in the ferromagnetic materials and an attenuation time constant, the residual magnetizations occurring when the magnetic flux return paths are interrupted by the magnetic flux return coils changing to a resistive state due to thermal instability.

Figure 5:
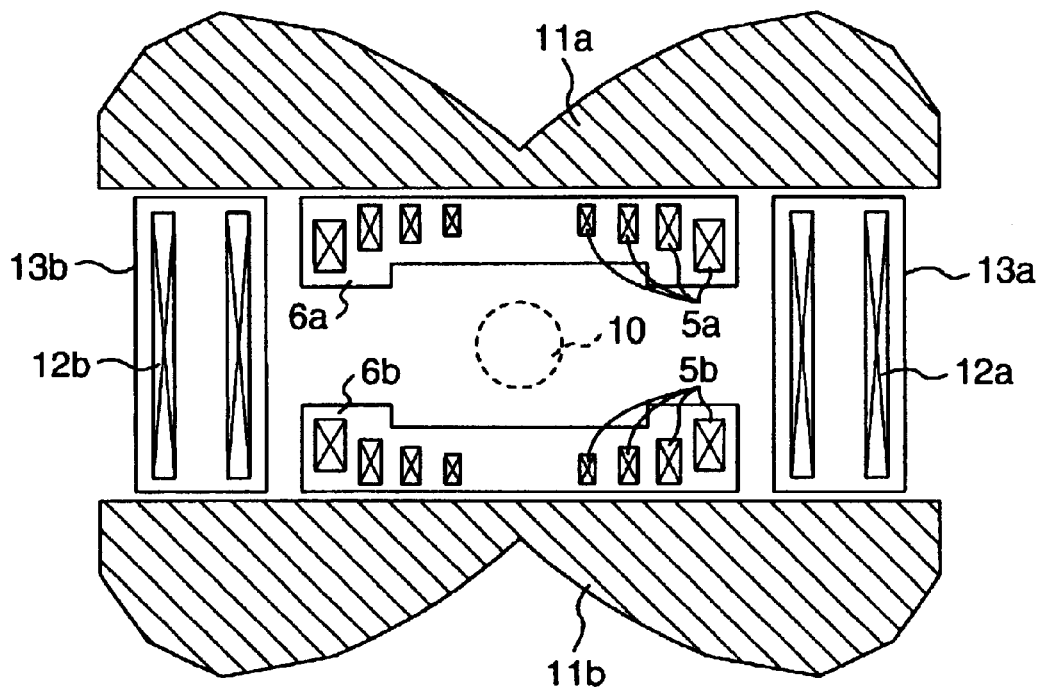
FIG. 5 is a cross-sectional view showing a construction of a magnet for the MRI apparatus according to another embodiment of the invention.

In the MRI magnet the homogeneity of the static magnetic field is important. In this embodiment, the field homogeneity is secured by two pairs of coils and magnetic poles formed with grooves, as shown in the figure. Means for securing the field homogeneity is not limited to the configuration of this embodiment. For example, a plurality of coils may be used instead of the magnetic poles formed with grooves, as shown in FIG. 5, to generate a homogeneous field.

Since a homogeneous field can be produced in the imaging volume by the static magnetic field generating units including the magnetic poles, there is no need to adjust the flow of flux in the magnetic flux path or to make the flow of flux introduced into the static magnetic field generating units homogeneously. However, for simplifying the construction of the magnetic poles, the flow of flux may be controlled by adjusting the geometry of the magnetic flux paths and using gaps and materials having magnetic anisotropy. Further, it is also possible to place in the magnetic flux paths ferromagnetic materials and permanent magnets that generate auxiliary magnetic fields.

Figure 6:
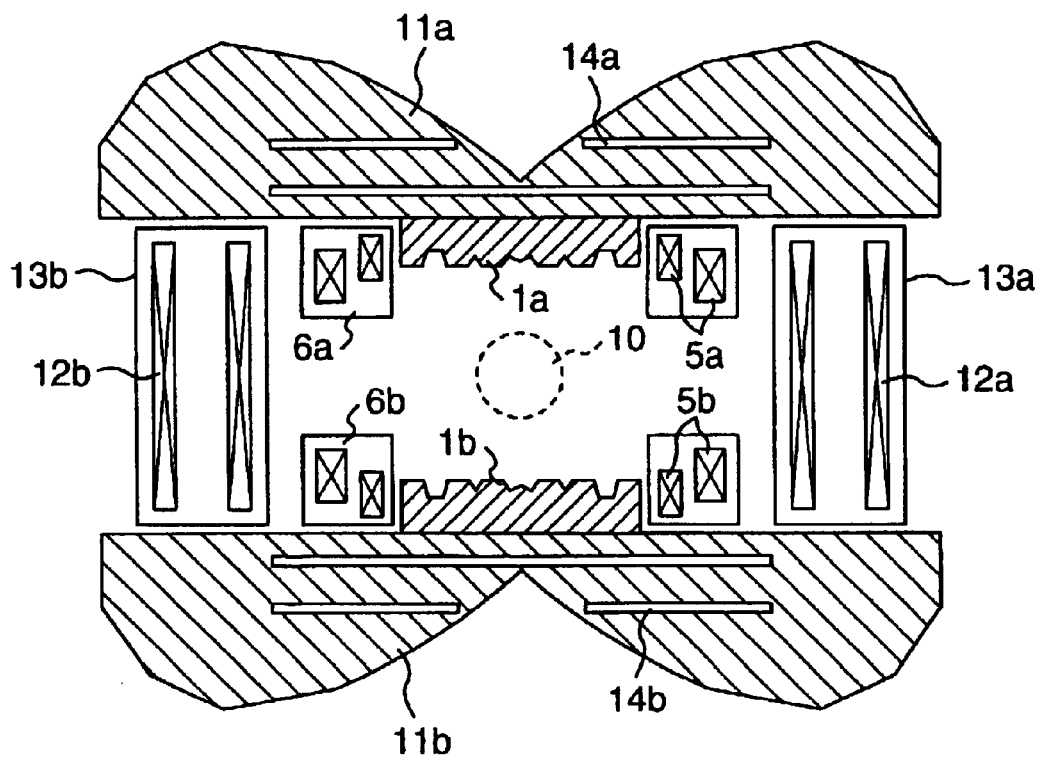
FIG. 6 is a cross-sectional view showing a construction of a magnet for the MRI apparatus according to still another embodiment of the invention.

For reducing the size of the 5-gauss line of leakage fluxes, it is important to confine the flux to the proximity of the magnet as it is returned to the field sources. Therefore, in this embodiment the yokes 11a, 11b of a ferromagnetic material are arranged above and below the static magnetic field generating units. To utilize these yokes more effectively for confining the flux, horizontal slits are formed in the yokes as shown in FIG. 6. While in the figure the upper and lower yokes are each shown to be formed with two slits 14a, 14b, they each actually have four 5-mm-thick slits. The slits extend from the center of the static magnetic field generating units to where the magnetic flux lines parallelly bend.

Since the flux tends to bend toward where the permeability is large, the flux going out upwardly from the static magnetic field generating unit bends so that it flows parallel to the air layer. Hence, the flux that would otherwise escape upwardly can be efficiently confined horizontally. With the flux confined compactly in this manner, the volume of the magnetic flux path of a ferromagnetic material required to pass the flux can be reduced, which in turn leads to a reduced weight. The use of the slits has reduced the weight of the yokes 11a, 11b down to about 39 tons.

Figure 7:
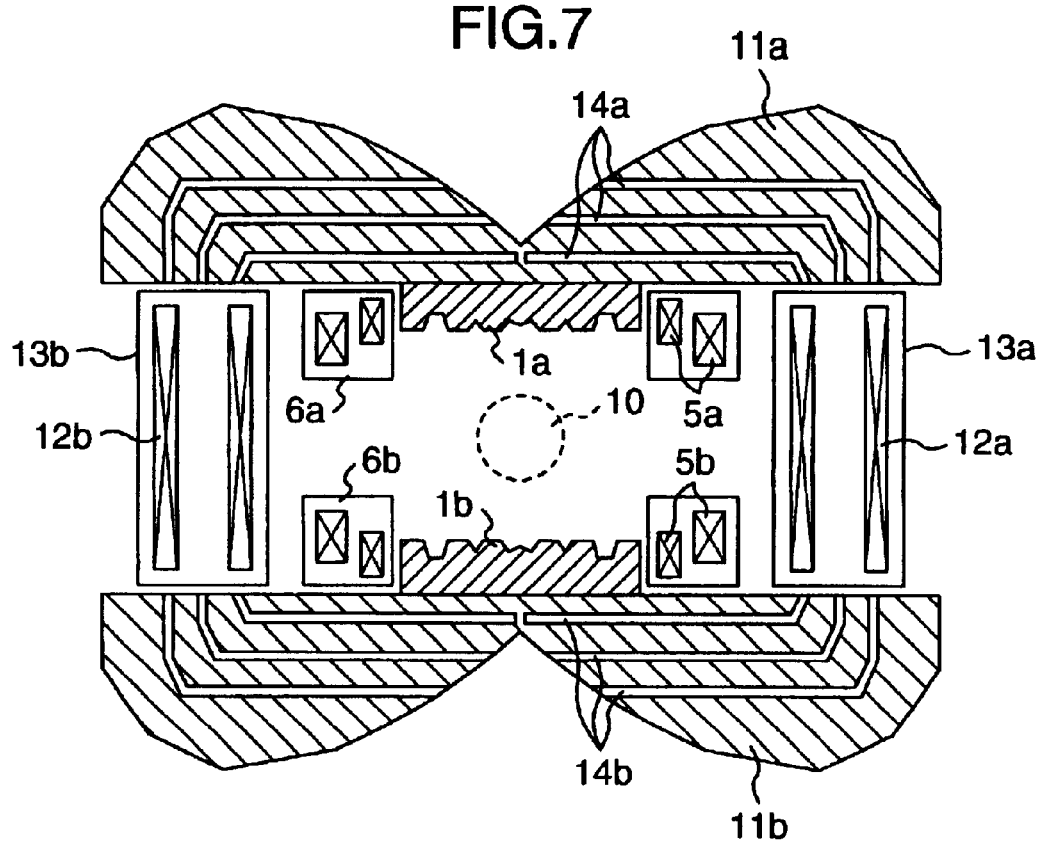
FIG. 7 is a cross-sectional view showing a construction of a magnet for the MRI apparatus according to yet another embodiment of the invention.

As described above, controlling the flux by taking advantage of a difference in permeability is very effective. The similar effects can also be produced by using laminated sheets of metal having a permeability anisotropy. While in this embodiment the slits are arranged in a part of the yokes, it is also effective to form such slits over the entire length of the yokes, as shown in FIG. 7, so as to form a desired flow of magnetic flux. The yokes having these slits may be formed by assembling constitutional parts.

Figure 8:
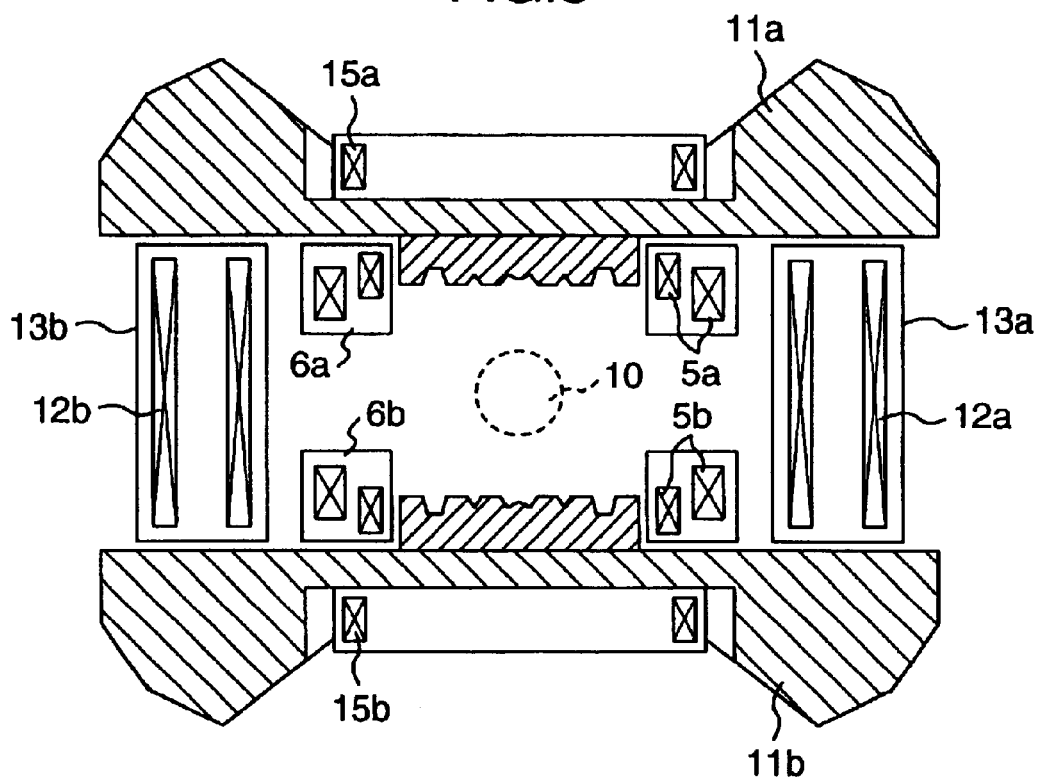
FIG. 8 is a cross-sectional view showing a construction of a magnet for the MRI apparatus according to a further embodiment of the invention.
Figure 9:
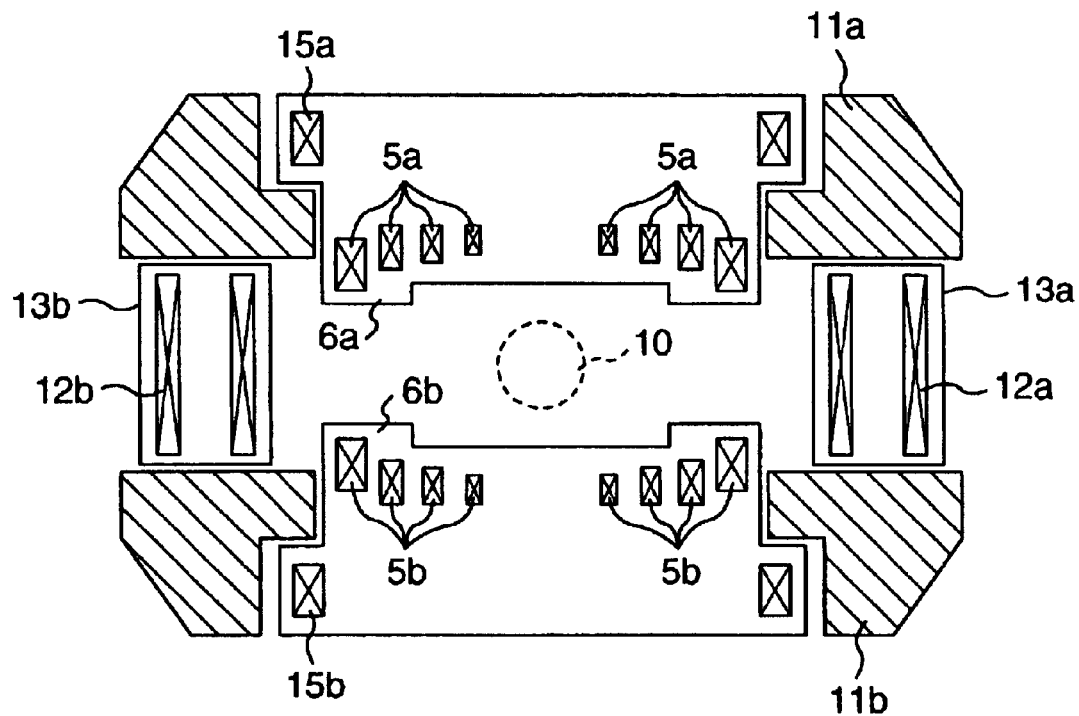
FIG. 9 is a cross-sectional view showing a construction of a magnet for the MRI apparatus according to a further embodiment of the invention.

In this embodiment, to realize a compact magnet with a reduced total height, the magnetic flux paths of ferromagnetic materials, that are designed to lead the leakage fluxes escaping vertically from the static magnetic field generating units to a horizontal direction, are arranged above and below the static magnetic field generating units. Another method for realizing a compact magnet involves, as shown in FIG. 8, installing above and below the static magnetic field sources magnetic flux control coils 15a, 15b that generate magnetic fields whose polarities are opposite to those of the static magnetic field generating units. A flux generated by the static magnetic field sources and a flux generated by the flux control coils collide with each other forming a flow of flux welling out horizontally. The shape of the magnetic flux control coils is not limited to a circle and their attitude not limited to a perfectly horizontal one. In the toroidal coil type, the returning fluxes all thread through the coils, whereas in this type the returning fluxes do not thread through the magnetic flux control coils. The presence of the yokes alleviates the degree to which the reverse magnetic fields generated by the magnetic flux control coils reduce the static magnetic field intensity in the imaging volume. The magnetic poles still have an effect of strengthening the intensity of the static magnetic field. The presence of yokes between the magnetic flux control coils and the static magnetic field generating units increases the number of cryostats and complicates the structure. To solve this problem, a method may be adopted which involves eliminating the yokes and the magnetic poles and storing the magnetic flux control coils and the coils of the static magnetic field generating units in the same cryostat, as shown in FIG. 9. In this method, the magnetic flux control coils tend to increase in size and thus the reverse magnetic field generated by the magnetic flux control coils have a greater influence on the imaging volume, resulting in an increase in the magnetomotive force of the static magnetic field generating units. This method, however, can greatly reduce the weight of the magnet.

Figure 10:
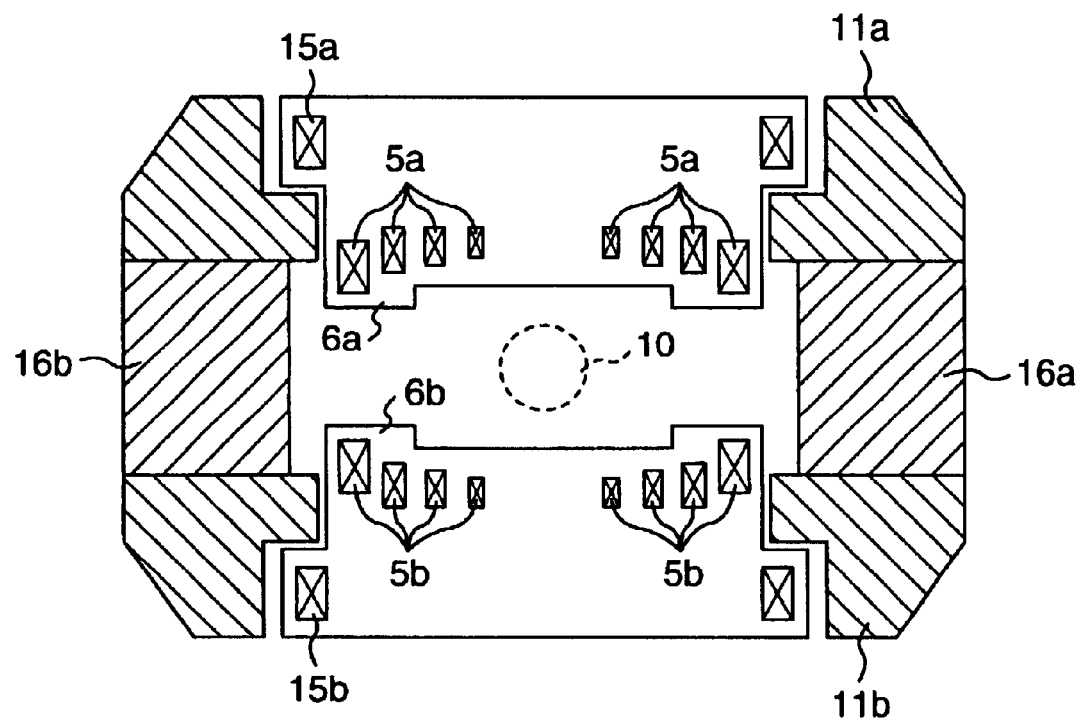
FIG. 10 is a cross-sectional view showing a construction of a magnet for the MRI apparatus according to a further embodiment of the invention.

A magnet shown in FIG. 10 has yoke columns 16a, 16b that have replaced the magnetic flux return coils of FIG. 9. In the MRI apparatus, vibrations of the magnet vary the magnetic field in the imaging volume and greatly influence the quality of an image formed. By replacing the magnetic flux return coils with the yoke columns 16a, 16b to increase the rigidity of the magnet, the resonance frequency can be shifted to a higher frequency side, allowing the amplitude to be reduced. Although this arrangement increases the weight of the magnet, the influence of vibrations can be reduced while maintaining the magnitude of the leakage fluxes at about the same level as in other types of magnet.

Figure 11:
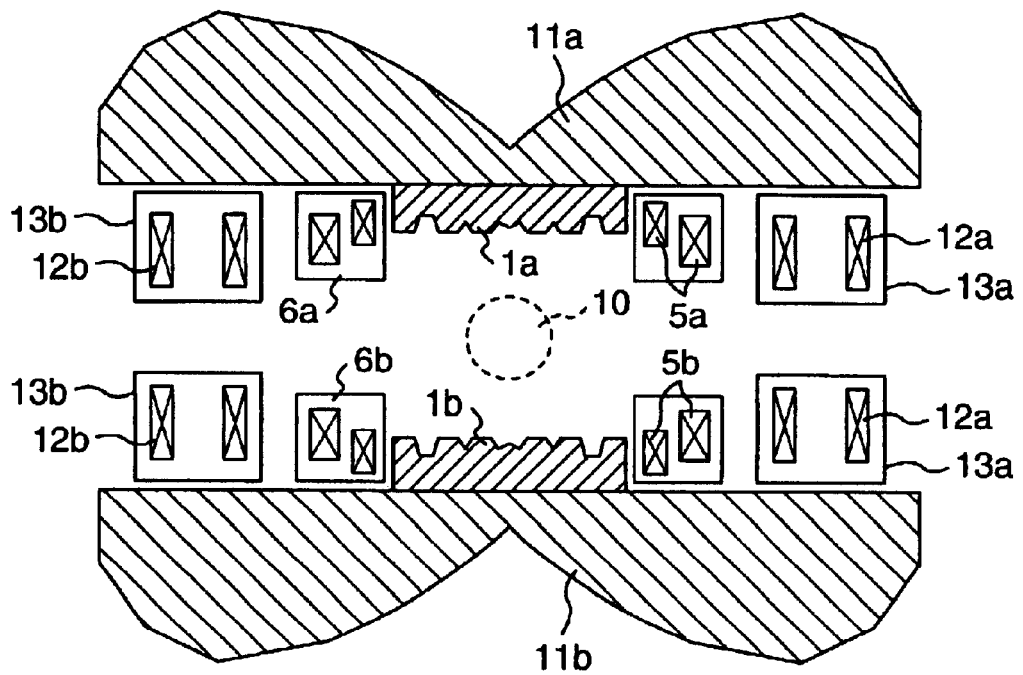
FIG. 11 is a cross-sectional view showing a construction of a magnet for the MRI apparatus according to a further embodiment of the invention.
Figure 12:
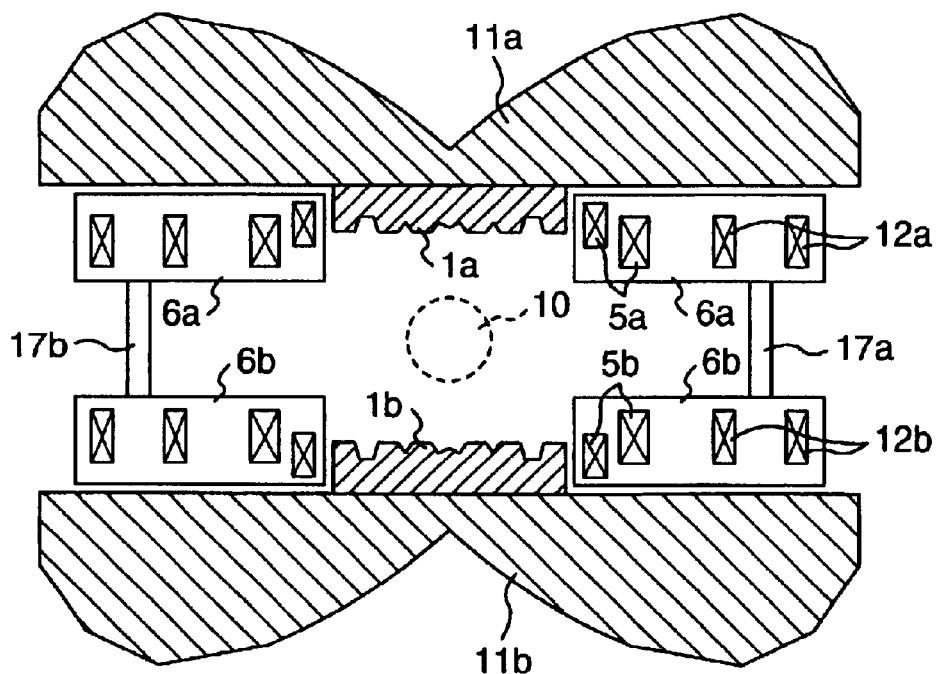
FIG. 12 is a cross-sectional view showing a construction of a magnet for the MRI apparatus according to a further embodiment of the invention.

A magnet shown in FIG. 11 has the magnetic flux return coils of FIG. 1 divided into top and bottom coils, with a gap formed at each center between the divided coils. Thus, four magnetic flux return coils are shown. A structure for supporting iron members and cryostats are not shown. A more preferred embodiment is shown in FIG. 12, in which coils making up the magnet are divided into top and bottom groups and the coils of each group are installed in one integral cryostat which is formed flat at its bottom surface. This arrangement can significantly simplify the structure of the cryostats. The upper and lower cryostats are connected by joint pipes 17a, 17b, through which electric circuits, cooling systems and coil supporting structures for the upper and lower coils are connected (not shown). The joint pipes can be made much smaller in diameter than the magnetic flux return coils that are arranged as single continuous columns between yokes, thereby greatly improving the openness of the magnet.

In the MRI magnet described above, since the magnetic circuit is comprised of flux paths generated by the ferromagnetic materials and flux paths generated by the magnetic flux return coils or the magnetic flux control coils, even when the static magnetic field intensity exceeds 1 tesla, the 5-gauss line of the leakage fluxes can be confined within a sphere 3.5 m in radius while minimizing the weight increase of the magnet. Further, by adopting the construction that compactly leads to the horizontal direction the flux which would otherwise escape vertically from the static magnetic field sources, the overall height increase of the magnet can be minimized and the magnet with a total height within 3 m can be realized.

The magnet for magnetic resonance imaging apparatus described in the foregoing includes, for example, a plurality of static magnetic field generating units arranged to generally oppose each other, an imaging volume formed by the opposing static magnetic field generating units, and a magnetic circuit to return magnetic fluxes generated by the static magnetic field generating units, wherein the magnetic circuit includes a magnetic flux path formed by a ferromagnetic material such as iron and a magnetic flux path formed by an arrangement of current, such as coil-shaped current. In this specification, the arrangement of current is accomplished, for example, by the superconducting materials described above and its geometry may include a coil-shaped current, a sheet-shaped current and a bulk superconductor, or a combination of these.

It should be further understood by those skilled in the art that although the foregoing description has been made on embodiments of the invention, the invention is not limited thereto and various changes and modifications may be made without departing from the spirit of the invention and the scope of the appended claims.

We claim:

1. A magnet for magnetic resonance imaging apparatus comprising:

a plurality of static magnetic field generating units arranged to generally oppose each other;

an imaging volume formed by the opposing static magnetic field generating units; and a magnetic circuit to return magnetic fluxes generated by the static magnetic field generating units;

wherein the magnetic circuit comprises a first magnetic flux path formed by a ferromagnetic material and a second magnetic flux path formed by a magnetic flux return coil, said magnetic fluxes being gassed through said first magnetic flux path in a horizontal direction, and said magnetic fluxes being passed through said second magnetic flux oath in a vertical direction.

2. A magnet for magnetic resonance imaging apparatus according to claim 1, wherein the static magnetic field generating units are arranged to generate a vertical magnetic field in the imaging volume.

3. A magnet for magnetic resonance imaging apparatus according to claim 1, wherein the magnetic flux return coil is formed by superconducting materials including superconducting metal materials selected from NbTi, $Nb_3Sn$, $Nb_3Al$ or $MgB_2$, or superconducting oxide materials selected from Bi—, Y—, Ti— or Hg—based materials.

4. A magnet for magnetic resonance imaging apparatus according to claim 1 or 2, wherein, in the magnetic flux paths of ferromagnetic materials, areas of different permeabilities, such as gaps and slits, are formed or materials having permeability anisotropy, such as laminated sheets of metal, are used to provide the magnetic flux paths of ferromagnetic materials with a macroscopic permeability anisotropy.

5. A magnet for magnetic resonance imaging apparatus according to claim 1, further including a plurality of magnetic return paths.

6. A magnet for magnetic resonance imaging apparatus according to claim 1 or 2, wherein ring currents that form the magnetic flux paths include a ring current not threading through most of the returning fluxes.

7. A magnet for magnetic resonance imaging apparatus according to claim 1 or 2, wherein a ferromagnetic material such as iron is placed in the magnetic flux paths formed by the arrangement of current.

8. A magnet for magnetic resonance imaging apparatus according to claim 1, wherein volumes to accommodate a medium for cooling coils and a cooling device are provided in spaces inside the coil.

9. A magnetic resonance imaging apparatus having the magnet for magnetic resonance imaging apparatus as claimed in claim 1.

* * * * *